(12) United States Patent
El-Hinnawy et al.

(10) Patent No.: US 11,057,019 B2
(45) Date of Patent: Jul. 6, 2021

(54) NON-VOLATILE ADJUSTABLE PHASE SHIFTER USING NON-VOLATILE RADIO FREQUENCY (RF) SWITCH

(71) Applicant: Newport Fab, LLC, Newport Beach, CA (US)

(72) Inventors: Nabil El-Hinnawy, Irvine, CA (US); Gregory P. Slovin, Irvine, CA (US); Chris Masse, Irvine, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/430,164

(22) Filed: Jun. 3, 2019

(65) Prior Publication Data

US 2020/0059220 A1 Feb. 20, 2020

Related U.S. Application Data

(63) Continuation-in-part of application No. 16/420,043, filed on May 22, 2019, which is a continuation-in-part
(Continued)

(51) Int. Cl.
*H01L 45/00* (2006.01)
*H01L 23/66* (2006.01)
(Continued)

(52) U.S. Cl.
CPC .............. *H03H 11/20* (2013.01); *H01L 23/66* (2013.01); *H01L 45/06* (2013.01); *H01L 45/126* (2013.01);
(Continued)

(58) Field of Classification Search
None
See application file for complete search history.

(56) References Cited

U.S. PATENT DOCUMENTS 7,522,029 B1 4/2009 Lantz
8,314,983 B2 11/2012 Frank
(Continued)

FOREIGN PATENT DOCUMENTS

WO WO 2016/028362 2/2016

OTHER PUBLICATIONS

"Phase-change RF switches with Robust Switching Cycle Endurance " by Moon et al. (Year: 2018).*
(Continued)

*Primary Examiner* — Evren Seven
(74) *Attorney, Agent, or Firm* — Farjami & Farjami LLP

(57) ABSTRACT

A non-volatile adjustable phase shifter is coupled to a transceiver in a wireless communication device. The non-volatile adjustable phase shifter includes a non-volatile radio frequency (RF) switch. In one implementation, the non-volatile RF switch is a phase-change material (PCM) RF switch. In one approach, the non-volatile adjustable phase shifter includes a selectable transmission delay arm and a selectable transmission reference arm. A phase shift caused by the non-volatile adjustable phase shifter is adjusted when the non-volatile RF switch engages with or disengages from the selectable transmission delay arm. In another approach, the non-volatile adjustable phase shifter includes a selectable impedance element. A phase shift caused by the non-volatile adjustable phase shifter is adjusted when the non-volatile RF switch engages with or disengages from the selectable impedance element. In either approach, the phase shift changes a phase of RF signals being transmitted from or received by the transceiver.

17 Claims, 6 Drawing Sheets

Related U.S. Application Data of application No. 16/418,130, filed on May 21, 2019, which is a continuation-in-part of application No. 16/418,930, filed on May 21, 2019, now Pat. No. 10,536,124, which is a continuation-in-part of application No. 16/161,960, filed on Oct. 16, 2018, which is a continuation-in-part of application No. 16/114,106, filed on Aug. 27, 2018, which is a continuation-in-part of application No. 16/103,646, filed on Aug. 14, 2018, now Pat. No. 10,475,993, which is a continuation-in-part of application No. 16/103,587, filed on Aug. 14, 2018, now Pat. No. 10,461,253, which is a continuation-in-part of application No. 16/103,490, filed on Aug. 14, 2018, now Pat. No. 10,476,001.

(51) Int. Cl.
| | |
|---|---|
| *H03H 11/20* | (2006.01) |
| *H01Q 3/26* | (2006.01) |
| *H04B 1/44* | (2006.01) |
| *H04L 5/14* | (2006.01) |
| *H01Q 21/22* | (2006.01) |

(52) U.S. Cl.
CPC ...... *H01L 45/1226* (2013.01); *H01L 45/1286* (2013.01); *H01L 45/143* (2013.01); *H01L 45/144* (2013.01); *H01Q 3/2694* (2013.01); *H01Q 21/22* (2013.01); *H04B 1/44* (2013.01); *H04L 5/1461* (2013.01)

(56) References Cited

U.S. PATENT DOCUMENTS

| | | | |
|---|---|---|---|
| 9,257,647 B2 | 2/2016 | Borodulin | |
| 9,362,492 B2 | 6/2016 | Goktepeli | |
| 9,368,720 B1 | 6/2016 | Moon et al. | |
| 9,444,430 B1 | 9/2016 | Abdo | |
| 9,601,545 B1 | 3/2017 | Tu | |
| 9,640,759 B1 | 5/2017 | Curioni | |
| 9,891,112 B1 | 2/2018 | Abel | |
| 9,917,104 B1 | 3/2018 | Roizin | |
| 10,128,243 B2 | 11/2018 | Yoo | |
| 10,164,608 B2 | 12/2018 | Belot | |
| 10,529,922 B1 | 1/2020 | Howard | |
| 2004/0113232 A1 | 6/2004 | Johnson et al. | |
| 2005/0127348 A1 | 6/2005 | Horak | |
| 2005/0212090 A1 | 9/2005 | Friedrich et al. | |
| 2006/0246712 A1 | 11/2006 | Kim | |
| 2007/0075347 A1 | 4/2007 | Lai | |
| 2007/0099405 A1 | 5/2007 | Oliva et al. | |
| 2008/0042243 A1 | 2/2008 | Lee et al. | |
| 2008/0142775 A1 | 6/2008 | Chen | |
| 2009/0115052 A1 | 5/2009 | Treece et al. | |
| 2010/0084626 A1 | 4/2010 | Delhougne | |
| 2010/0238720 A1 | 9/2010 | Tio Castro | |
| 2011/0291784 A1 | 12/2011 | Nakatsuji | |
| 2013/0187120 A1 | 7/2013 | Redaelli | |
| 2013/0285000 A1 | 10/2013 | Arai | |
| 2014/0191181 A1 | 7/2014 | Moon | |
| 2014/0264230 A1 | 9/2014 | Borodulin | |
| 2014/0339610 A1 | 11/2014 | Rashed | |
| 2015/0048424 A1 | 2/2015 | Tien | |
| 2015/0090949 A1 | 4/2015 | Chang | |
| 2015/0104921 A1* | 4/2015 | Terai | H01L 45/146 438/382 |
| 2015/0333131 A1 | 11/2015 | Mojumder | |
| 2016/0035973 A1 | 2/2016 | Raieszadeh | |
| 2016/0056373 A1 | 2/2016 | Goktepeli | |
| 2016/0300612 A1 | 10/2016 | Manipatruni et al. | |
| 2016/0308507 A1 | 10/2016 | Engelen | |
| 2017/0092694 A1 | 3/2017 | BrightSky | |
| 2017/0126205 A1 | 5/2017 | Lin | |
| 2017/0187347 A1 | 6/2017 | Rinaldi | |
| 2017/0243861 A1 | 8/2017 | Wang | |
| 2017/0365427 A1 | 12/2017 | Borodulin | |
| 2018/0005786 A1 | 1/2018 | Navarro | |
| 2018/0138894 A1* | 5/2018 | Belot | H01L 45/1206 |
| 2018/0194615 A1 | 7/2018 | Nawaz | |
| 2018/0269393 A1 | 9/2018 | Zhang | |
| 2019/0064555 A1 | 2/2019 | Hosseini | |
| 2019/0067572 A1 | 2/2019 | Tsai | |
| 2019/0172657 A1 | 6/2019 | Zhu | |
| 2019/0267214 A1 | 8/2019 | Liu | |
| 2019/0296718 A1* | 9/2019 | Birkbeck | H03H 17/0054 |

OTHER PUBLICATIONS

G. Slovin, et al. "AIN Barriers for Capacitance Reduction in Phase-Change RF Switches," in *IEEE Electron Device Letters*, vol. 37, No. 5, pp. 568-571, May 2016.

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium* (CSICS), Monterey, CA, 2013, pp. 1-4.

Moon, et al. "Phase-Change RF Switches with Robust Switching Cycle Endurance," *2018 IEEE Radio and Wireless Symposium* (RWS), pp. 231-233, Jan. 2018, Anaheim, CA.

Wang, et al. "Directly Heated Four-Terminal Phase Change Switches," *2014 IEEE MTT-S International Microwave Symposium* (IMS2014), pp. 1-4, Jun. 2014, Tampa, FL.

Tombak, et al. "Cellular Antenna Switches for Multimode Applications Based on a Silicon-on-Insulator Technology," *2010 IEEE Radio Frequency Integrated Circuits Symposium* (RFIC), pp. 271-274, May 2010, Anaheim, CA.

* cited by examiner

NON-VOLATILE ADJUSTABLE PHASE SHIFTER USING NON-VOLATILE RADIO FREQUENCY (RF) SWITCH

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material". The present application is also a continuation-in-part of and claims the benefit of and priority to application Ser. No. 16/103,587 filed on Aug. 14, 2018, titled "Design for High Reliability RF Switch Based on Phase-Change Material". The present application is also a continuation-in-part of and claims the benefit of and priority to application Ser. No. 16/103,646 filed on Aug. 14, 2018, titled "PCM RF Switch Fabrication with Subtractively Formed Heater". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element". The present application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance". The present application is further a continuation-in-part of and claims the benefit of and priority to application Ser. No. 16/418,130 filed on May 21, 2019, titled "Radio Frequency (RF) Filtering Using Phase-Change Material (PCM) RF Switches". The present application is also a continuation-in-part of and claims the benefit of and priority to application Ser. No. 16/418,930 filed on May 21, 2019, titled "Power Amplifier Module Using Phase-Change Material (PCM) Radio Frequency (RF) Switches and Selectable Matching Networks". The present application is further a continuation-in-part of and claims the benefit of and priority to application Ser. No. 16/420,043 filed on May 22, 2019, titled "Radio Frequency (RF) Module Using a Tunable RF Filter with Non-Volatile RF Switches". The disclosures and contents of all of the above-identified applications are hereby incorporated fully by reference into the present application.

BACKGROUND

Radio frequency (RF) communication devices such as phased array antenna panels in 5G (fifth generation wireless) communications, may employ phase shifters to change phases of RF signals being transmitted from or received by the phased array antenna panels. However, phase shifters are often limited in terms of the phase shifts they can provide. Some phase shifters may be static and unable to change the amount of phase shift produced or to provide dynamic combinations of phase shifts.

Attempts to utilizes switches for adjusting an individual phase shifter to produce varying amounts of phase shifts or more dynamic combinations of phase shifts have encountered difficulties. Integrating such switches in RF communication solutions generally results in disadvantageous and significant performance tradeoffs. For example, conventional switches are typically volatile and do not maintain their states during power off. Conventional switches may also be unreliable and vary over time. As another example, conventional switches introduce significant insertion losses. Especially at 5G frequencies and higher, these losses can prohibit RF communication as intended.

In one approach, amplifiers can be used in phase shifters to provide gain and compensate for insertion losses. Integrating amplifiers generally increases costs and design complexity. Amplifiers may consume significant power and drain batteries faster. Further, including amplifiers in phase shifters creates difficulties in reciprocal applications, such as duplex communication.

Thus, there is need in the art for an adjustable phase shifting solution with a low insertion loss that is also non-volatile, reliable, and reciprocal.

SUMMARY

The present disclosure is directed to non-volatile adjustable phase shifters using non-volatile radio frequency (RF) switches, substantially as shown in and/or described in connection with at least one of the figures, and as set forth in the claims.

DETAILED DESCRIPTION

Figure 1:
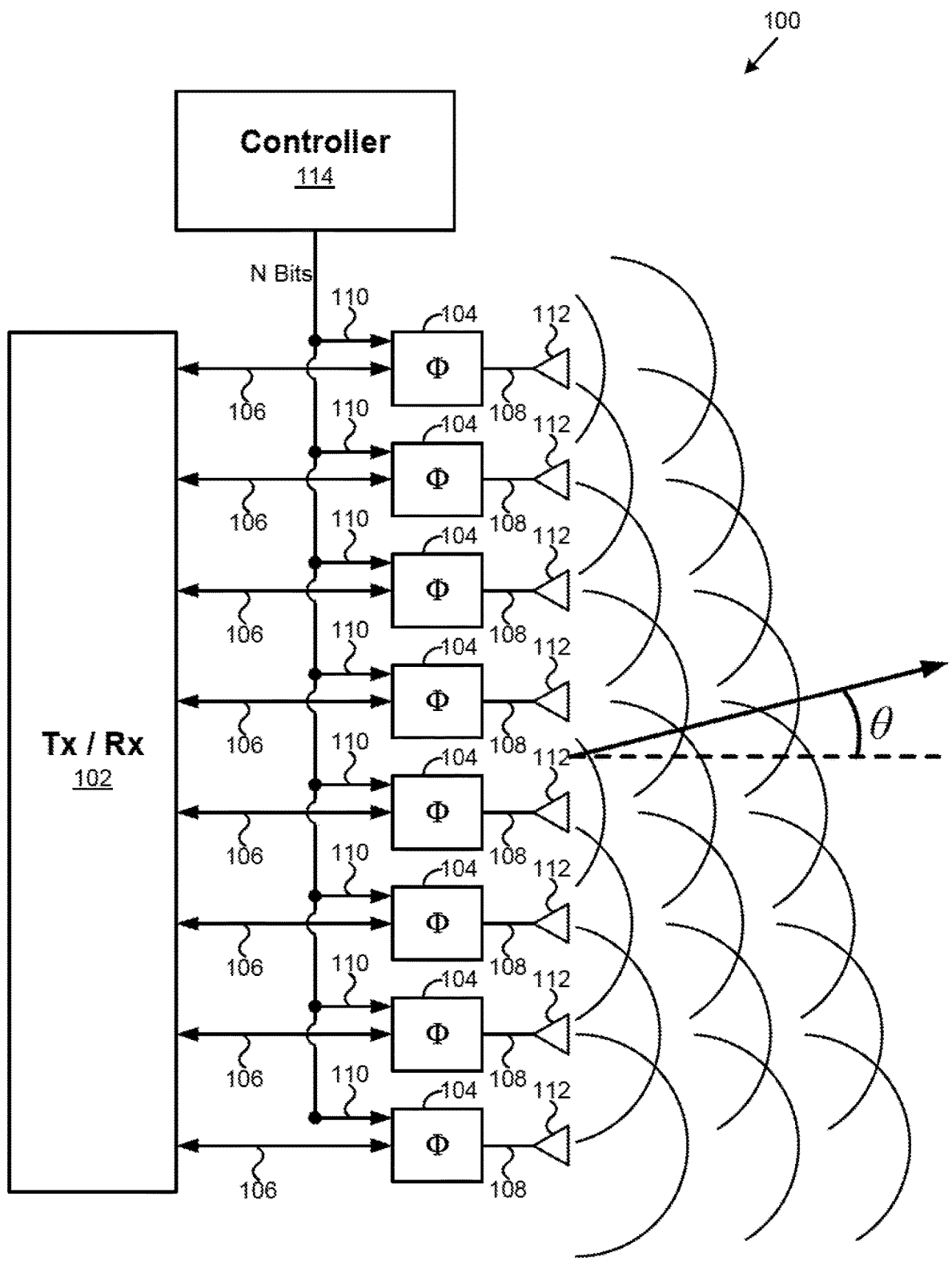
FIG. 1 illustrates a portion of wireless communication device including non-volatile adjustable phase shifters according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions. Further, in the present application the terms "connected" to/with or "coupled" to/with may be used interchangeably to have the same or similar meaning, and each term may mean direct or indirect connection.

FIG. 1 illustrates a portion of wireless communication device including non-volatile adjustable phase shifters according to one implementation of the present application. Wireless communication device 100 includes transceiver (receiver/transmitter) 102, non-volatile adjustable phase shifters 104 each having terminals 106, 108, and 110, antennas 112, and controller 114. Transceiver 102 is coupled to terminals 106 of corresponding non-volatile adjustable phase shifters 104. Antennas 112 are coupled to terminals 108 of corresponding non-volatile adjustable phase shifters 104. Controller 114 is coupled to terminals 110 of corresponding non-volatile adjustable phase shifters 104.

Transceiver 102 transmits and receives radio frequency (RF) signals, while non-volatile adjustable phase shifters 104 cause corresponding phase shifts that change phases of the RF signals being transmitted from or received by transceiver 102. As a result of these phase shifts, phase shifted RF signals transmitted from or received by antennas 112 can interfere constructively or destructively to form a directed RF beam at desired angle θ in a manner known in the art.

Non-volatile adjustable phase shifters 104 are adjustable and they can cause different phase shifts in a novel and inventive manner according to various implementations of the present application. Controller 114 is coupled to terminals 110 of corresponding non-volatile adjustable phase shifters 104. As described below, controller 114 controls the phase shifts produced by non-volatile adjustable phase shifters 104 by controlling non-volatile switches (not shown in FIG. 1) that engage with and disengage from various structures inside non-volatile adjustable phase shifters 104. As a result, non-volatile adjustable phase shifters 104 provide adaptive beamforming and can vary the desired RF beam angle θ.

Non-volatile adjustable phase shifters 104 are also non-volatile in that they continue to cause phase shifts to RF signals even without applied power. As described below, controller 114 can provide electrical pulses to program non-volatile RF switches (not shown in FIG. 1) and adjust the phase shifts of non-volatile adjustable phase shifters 104. After non-volatile adjustable phase shifters 104 are adjusted, non-volatile adjustable phase shifters 104 continue to cause phase shifts to RF signals. However, controller 114 does not need to provide electrical pulses again until the next adjustment. As a result, non-volatile adjustable phase shifters 104 can maintain an RF beam at desired angle θ.

In the present implementation, wireless communication device 100 is in a transmit mode. Terminals 106 act as inputs of non-volatile adjustable phase shifters 104, terminals 108 act as outputs of non-volatile adjustable phase shifters 101, and antennas 112 transmit an RF beam. In another implementation, antennas 112 can receive an RF beam, terminals 108 can act as inputs of non-volatile adjustable phase shifters 104, and terminals 106 can act as outputs of non-volatile adjustable phase shifters 104. Thus, non-volatile adjustable phase shifters 104 are reciprocal and cause phase shifts in either direction.

In various implementations, transceiver 102 can include modems, digital signal processors, digital-to-analog converters, mixers, or other components for transmitting or receiving RF signals. In various implementations, wireless communication device 100 can include more or fewer antennas than shown in FIG. 1. In various implementations, non-volatile adjustable phase shifters 104 may be multi-bit phase shifters having $2^M$ possible phase shifts, where M represents a number of bits. Controller 114 can provide N bits of control data to each of non-volatile adjustable phase shifters 104. In various implementations, M is greater than N. In one implementation, pulse generators (not shown in FIG. 1) can be included in or between controller 114 and non-volatile adjustable phase shifters 104, and controller 114 can provide decoder signals for connecting the pulse generators to selected non-volatile RF switches (not shown in FIG. 1) in non-volatile adjustable phase shifters 104. In various implementations, terminals 110 can each include more than one connection point and/or can provide inverting and non-inverting connections.

In the present implementation, wireless communications device 100 employs non-volatile adjustable phase shifters 104 and antennas 112 in a phased array antenna panel. In one implementation, the phased array antenna panel is configured for 5G wireless communications (fifth generation mobile networks or fifth generation wireless systems). In one implementation, the phased array antenna panel is configured to receive and/or transmit signals from and or to one or more commercial geostationary communication satellites or low earth orbit satellites. In various implementations, wireless communications device 100 can be included in a consumer electronic device, such as a mobile phone, a tablet, or another personal wireless communication device. In various implementations, non-volatile adjustable phase shifters 104 can be implemented in a device other than wireless communication device 100 in FIG. 1. For example, non-volatile adjustable phase shifters 104 can be implemented in a phase-locked loop.

Figure 2A:
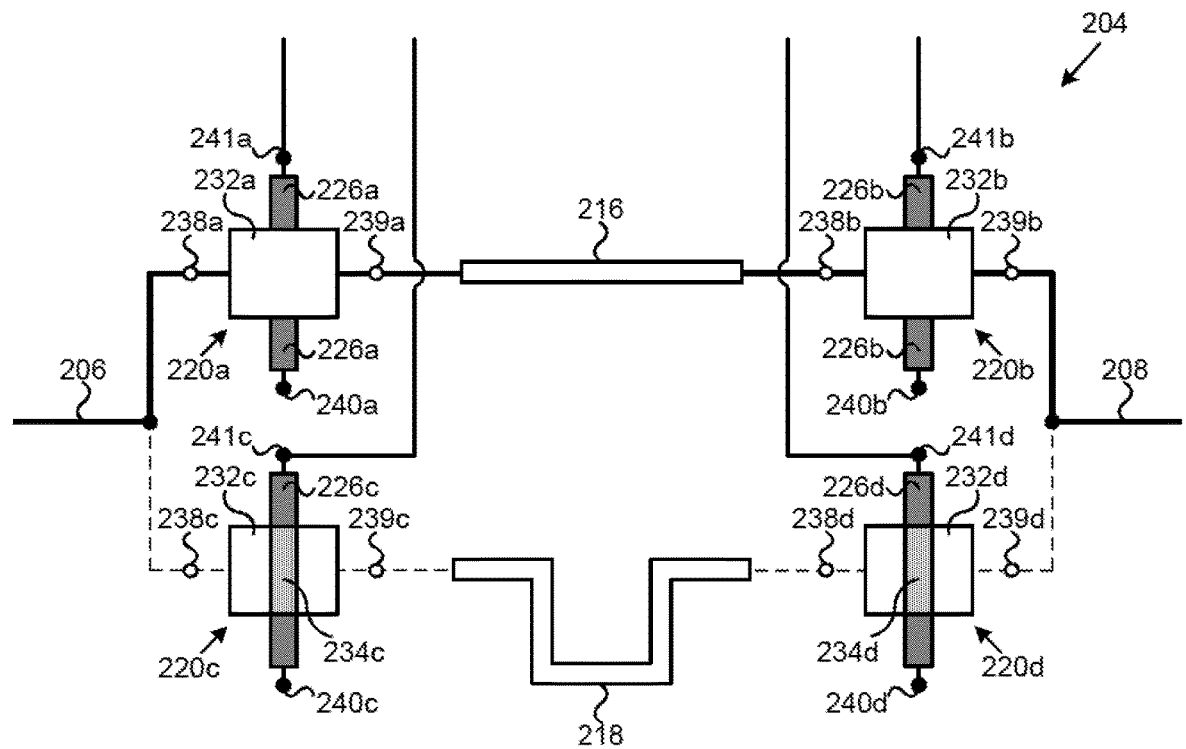
FIGS. 2A and 2B illustrate a portion of a non-volatile adjustable phase shifter employing non-volatile RF switches according to one implementation of the present application.
Figure 2B:
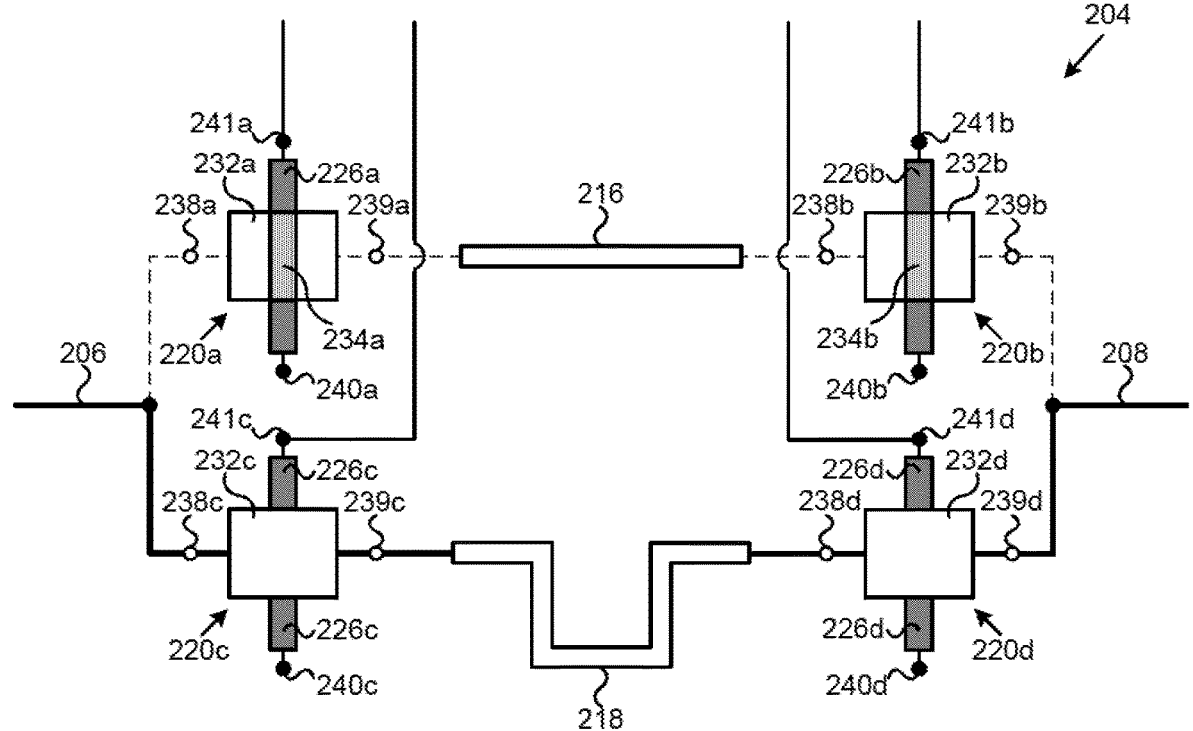

FIGS. 2A and 2B illustrate a portion of a non-volatile adjustable phase shifter employing non-volatile RF switches according to one implementation of the present application. Non-volatile adjustable phase shifter 204 includes terminals 206 and 208, phase-change material (PCM) RF switches 220a, 220b, 220c, and 220d, selectable transmission reference arm 216, and selectable transmission delay arm 218. Non-volatile adjustable phase shifter 204 in FIGS. 2A and 2B generally corresponds to any of non-volatile adjustable phase shifters 104 in FIG. 1. Similarly, terminals 206 and 208 in FIGS. 2A and 2B generally correspond to any of terminals 106 and 108 respectively in FIG. 1.

PCM RF switch 220a includes heating element 226a, phase-change material (PCM) 232a, PCM contacts 238a and 239a, and heater contacts 240a and 241a. Similarly, PCM RF switches 220b, 220c, and 220d include respective heating elements 226b, 226c, and 226d, respective PCMs 232b, 232c, and 232d, respective PCM contacts 238b and 239b, 238c and 239c, and 238d and 239d, and respective heater contacts 240b and 241b, 240c and 241c, and 240d and 241d.

Terminal 206 is coupled to PCM contact 238a of PCM RF switch 220a and to PCM contact 238c of PCM RF switch 220c. PCM contact 239a of PCM RF switch 220a is coupled to one end of selectable transmission reference arm 216. PCM contact 239c of PCM RF switch 220c is coupled to one end of selectable transmission delay arm 218. Another end of selectable transmission reference arm 216 is coupled to PCM contact 238b of PCM RF switch 220b. Another end of selectable transmission delay arm 218 is coupled to PCM contact 238d of PCM RF switch 220d. PCM contact 239b of PCM RF switch 220b and PCM contact 239d of PCM RF switch 220d are coupled to terminal 208.

PCM 232a is situated over and transverse to heating element 226a. As described below, heater contacts 240a and 241a provide power to heating element 226a for generating crystallizing heat pulses or amorphizing heat pulses for transforming an active segment of PCM 232a between crystalline and amorphous phases, thereby switching PCM RF switch 220a between ON and OFF states respectively. Heater contact 241a can be coupled to a pulse generator (not shown in FIG. 2A) that generates electrical pulses and provides power to heating element 226a. For example, heater contact 241a in FIG. 2A can be coupled to a pulse generator included in controller 114 in FIG. 1 through one of terminals 110 in FIG. 1. Heater contact 240a can be coupled to ground (not shown in FIG. 2A). In a similar fashion, active segments of PCMs 232b, 232c, and 232d can be transformed between crystalline and amorphous phases, thereby switching PCM RF switches 220b, 220c, and 220d between ON and OFF states.

In non-volatile adjustable phase shifter 204, PCM RF switches 220a and 220b engage with and disengage from selectable transmission reference arm 216. That is, PCM RF switches 220a and 220b are engaged with selectable transmission reference arm 216 when active segments of PCMs 232a and 232b are in crystalline phases, and PCM RF switches 220a and 220b are disengaged from selectable transmission reference arm 216 when active segments of PCMs 232a and 232b are in amorphous phases. Likewise, PCM RF switches 220c and 220d engage with and disengage from selectable transmission delay arm 218. In one implementation, PCM RF switches 220a and 220b engage or disengage concurrently, and PCM RF switches 220c and 220d engage or disengage concurrently.

As used in the present application, "engaged" refers to having a very low resistance electrical connection to other parts of a circuit through a connecting non-volatile RF switch, e.g., when PCM RF switches 220a and 220b (or PCM RF switches 220c and 220d), in the path of selectable transmission reference arm 216 (or selectable transmission delay arm 218), are in ON (very low resistance) states. Further, "disengaged" refers to when non-volatile RF switches are in OFF (very high resistance) states.

Non-volatile adjustable phase shifter 204 causes different phase shifts when selectable transmission reference arm 216 or selectable transmission delay arm 218 are engaged. When selectable transmission reference arm 216 is engaged, it introduces little or approximately no time delay between an input RF signal and an output RF signal. When selectable transmission delay arm 218 is engaged, it introduces a time delay relative to when selectable transmission reference arm 216 is engaged, causing an output RF signal to have a phase shift relative to an input RF signal. By way of one example, when selectable transmission reference arm 216 is engaged, an output RF signal at terminal 208 can have approximately zero degrees (0°) phase shift relative to an input RF signal at terminal 206. Meanwhile, when selectable transmission delay arm 218 is engaged, an output RF signal at terminal 208 can have approximately twenty-two and one-half degrees (22.5°) phase shift relative to an input RF signal at terminal 206.

In FIG. 2A, PCM RF switches 220a and 220b are in ON states. PCMs 232a and 232b are in crystalline phases, have low resistivity, and are able to easily conduct electrical current. An RF signal at terminal 206 propagates across PCM RF switch 220a through PCM contact 238a, PCM 232a, and PCM contact 239a, across selectable transmission reference arm 216, across PCM RF switch 220b, through PCM contact 238b, PCM 232b, and PCM contact 239b, to terminal 208. Accordingly, PCM RF switches 220a and 220b engage with selectable transmission reference arm 216. Continuing the above example, non-volatile adjustable phase shifter 204 in FIG. 2A may have a phase shift of approximately zero degrees (0°).

In FIG. 2A, PCM RF switches 220c and 220d are in OFF states. Active segments 234c and 234d of respective PCMs 232c and 232d are in crystalline phases, have high resistivity, and do not easily conduct electrical current. An RF signal at terminal 206 does not propagates across PCM RF switch 220c, selectable transmission delay arm 218, or PCM RF switch 220d. Accordingly, PCM RF switches 220c and 220d disengage from selectable transmission delay arm 218, as illustrated with dashed lines in FIG. 2A.

In FIG. 2B, PCM RF switches 220a, 220b, 220c, and 220d have changed states. Heating elements 226a and 226b have generated amorphizing heat pulses, for example, in response to electrical pulses from controller 114 in FIG. 1. Active segments 234a and 234b of respective PCMs 232a and 232b have transformed from crystalline phases to amorphous phases that do not easily conduct electrical current. PCM RF switches 220a and 220b in FIG. 2B are in OFF states. Accordingly, PCM RF switches 220a and 220b disengage from selectable transmission reference arm 216, as illustrated with dashed lines in FIG. 2B.

Conversely, heating elements 226c and 226d have generated crystallizing heat pulses, for example, in response to electrical pulses from controller 114 in FIG. 1. Active segments 234c and 234d of respective PCMs 232c and 232d have transformed from amorphous phases to crystalline phases that are able to easily conduct electrical current. PCM RF switches 220c and 220d in FIG. 2B are in ON states. Accordingly. PCM RF switches 220c and 220d engage with selectable transmission delay arm 218. Continuing the above example, non-volatile adjustable phase shifter 204 in FIG. 2B may have a phase shift of approximately twenty-two and one-half degrees (22.5°).

In the present implementation, non-volatile adjustable phase shifter 204 employs PCM RF switches 220a, 220b, 220c, and 220d as one example of non-volatile RF switches. However, non-volatile adjustable phase shifter 204 can employ any non-volatile switch known in the art. In one implementation, non-volatile adjustable phase shifter 204 can employ one non-volatile single-pole-double-throw (SPDT) switch instead of the two PCM RF switches 220a and 220c, and another non-volatile SPDT switch instead of PCM RF switches 220b and 220d.

Figure 3:
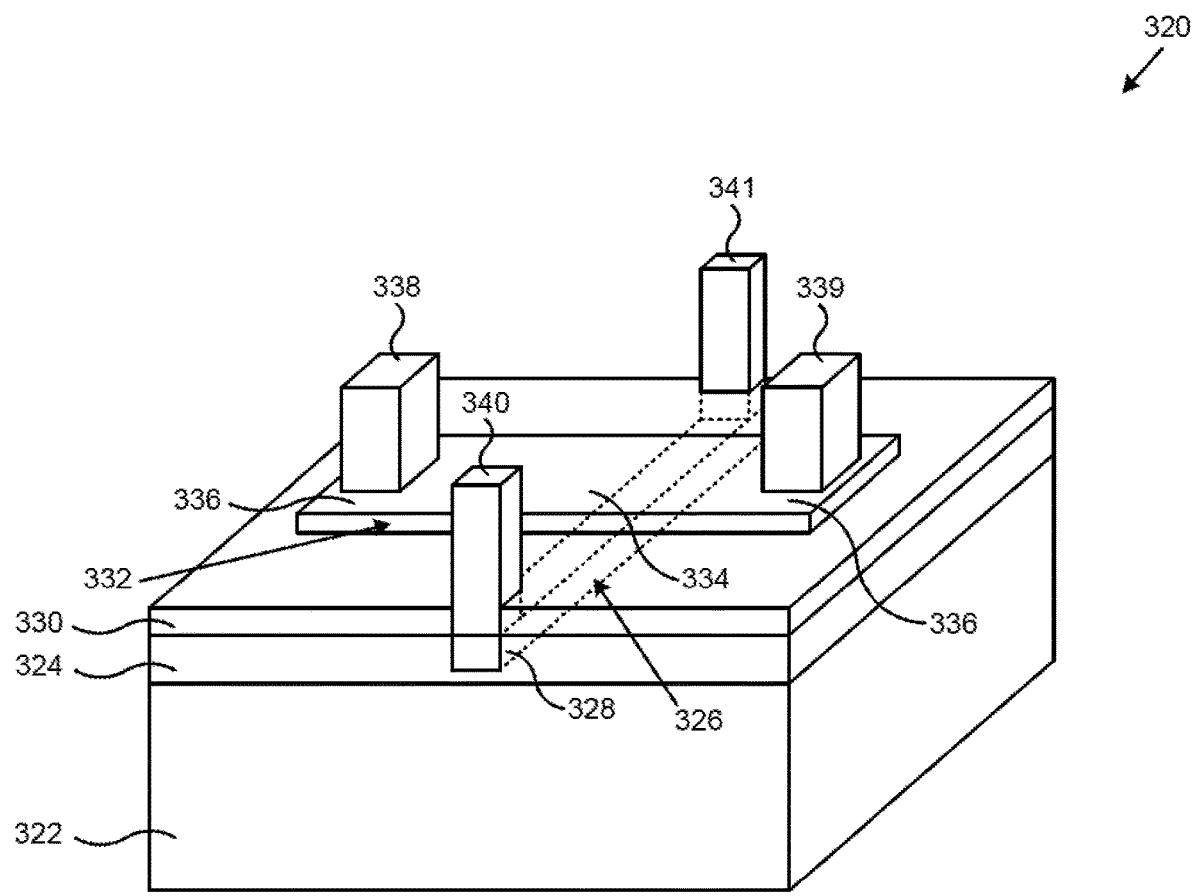
FIG. 3 illustrates a perspective view of a portion of a phase-change material (PCM) RF switch according to one implementation of the present application.

FIG. 3 illustrates a perspective view of a portion of a phase-change material (PCM) RF switch according to one implementation of the present application. PCM RF switch 320 in FIG. 3 generally corresponds to any of PCM RF switches 220a, 220b, 220c, and 220d in FIGS. 2A and 2B, and may have any implementations or advantages described above. As shown in FIG. 3, PCM RF switch 320 includes substrate 322, lower dielectric 324, heating element 326 having terminal segments 328, thermally conductive and electrically insulating material 330, PCM 332 having active segment 334 and passive segments 336, PCM contacts 338 and 339, and heater contacts 340 and 341. For purposes of illustration, the perspective view in FIG. 3 shows selected structures of PCM RF switch 320. PCM RF switch 320 may include other structures not shown in FIG. 3.

Substrate 322 is situated under lower dielectric 324. In one implementation, substrate 322 is an insulator, such as silicon oxide ($SiO_2$). In various implementations, substrate 322 is a silicon (Si), silicon-on-insulator (SOI), sapphire, complementary metal-oxide-semiconductor (CMOS), bipolar CMOS (BiCMOS), or group III-V substrate. In various implementations, substrate 322 includes a heat spreader or substrate 322 itself performs as a heat spreader. Substrate 322 can have additional layers (not shown in FIG. 3). In one implementation, substrate 322 can comprise a plurality of interconnect metal levels and interlayer dielectric layers. Substrate 322 can also comprise a plurality of devices, such as integrated passive devices (not shown in FIG. 3).

Lower dielectric 324 in PCM RF switch 320 is situated above substrate 322 and below thermally conductive and electrically insulating material 330. As shown in FIG. 3, lower dielectric 324 is also adjacent to sides of heating element 326. Lower dielectric 324 extends along the width of PCM RF switch 320, and is also coplanar with the top of heating element 326. Because PCM RF switch 320 includes lower dielectric 324 on the sides of heating element 326, less heat transfers horizontally (i.e., from the sides) and more heat dissipates vertically, from heating element 326 toward active segment 334 of PCM 332. In various implementations, lower dielectric 324 can have a relative width and/or a relative thickness greater or less than shown in FIG. 3. Lower dielectric 324 can comprise any material with thermal conductivity lower than that of thermally conductive and electrically insulating material 330.

Heating element 326 in PCM RF switch 320 is situated in lower dielectric 324. Heating element 326 also approximately defines active segment 334 of PCM 332. Heating element 326 generates a crystallizing heat pulse or an amorphizing heat pulse for transforming active segment 334 of PCM 332. Heating element 326 can comprise any material capable of Joule heating. Heating element 326 can be connected to electrodes of a pulse generator (not shown in FIG. 3) that generates voltage or current pulses. Preferably, heating element 326 comprises a material that exhibits minimal or substantially no electromigration, thermal stress migration, and/or agglomeration. In various implementations, heating element 326 can comprise tungsten (W), molybdenum (Mo), titanium (Ti), titanium tungsten (TiW), titanium nitride (TiN), tantalum (Ta), tantalum nitride (TaN), nickel chromium (NiCr), or nickel chromium silicon (NiCrSi). For example, in one implementation, heating element 326 comprises tungsten lined with titanium and titanium nitride.

Thermally conductive and electrically insulating material 330 in PCM RF switch 320 is situated on top of heating element 326 and lower dielectric 324, and under PCM 332 and, in particular, under active segment 334 of PCM 332. Thermally conductive and electrically insulating material 330 ensures efficient heat transfer from heating element 326 toward active segment 334 of PCM 332, while electrically insulating heating element 326 from PCM contacts 338 and 339, PCM 332, and other neighboring structures.

Thermally conductive and electrically insulating material 330 can comprise any material with high thermal conductivity and high electrical resistivity. In various implementations, thermally conductive and electrically insulating material 330 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating material 330 can be a nugget that does not extend along the width of PCM RF switch 320. For example, thermally conductive and electrically insulating material 330 can be a nugget approximately aligned with heating element 326.

PCM 332 in PCM RF switch 320 is situated on top of thermally conductive and electrically insulating material 330. PCM RF switch 320 utilizes PCM 332 to transfer input RF signals in an ON state and to block input RF signals in an OFF state. PCM 332 includes active segment 334 and passive segments 336. Active segment 334 of PCM 332 is approximately defined by heating element 326. Passive segments 336 of PCM 332 extend outward and are transverse to heating element 326, and are situated approximately under PCM contacts 338 and 339. As used herein, "active segment" refers to a segment of PCM that transforms between crystalline and amorphous phrases, for example, in response to a crystallizing or an amorphizing heat pulse generated by heating element 326, whereas "passive segment" refers to a segment of PCM that does not make such transformation and maintains a crystalline phase (i.e. maintains a conductive state).

With proper heat pulses and heat dissipation, active segment 334 of PCM 332 can transform between crystalline and amorphous phases, allowing PCM RF switch 320 to switch between ON and OFF states respectively. Active segment 334 of PCM 332 must be heated and rapidly quenched in order for PCM RF switch 320 to switch states. If active segment 334 of PCM 332 does not quench rapidly enough, it wall not transform, and PCM RF switch 320 will fail to switch states. How rapidly active segment 334 of PCM 332 must be quenched depends on the material, volume, and temperature of PCM 332. In one implementation, the quench time window can be approximately one hundred nanoseconds (100 ns) or greater or less.

PCM 332 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 332 can be germanium telluride having from forty percent to sixty percent germanium by composition (i.e., $Ge_XTe_Y$, where $0.4 \leq X \leq 0.6$ and $Y=1-X$). The material for PCM 332 can be chosen based upon ON state resistivity, OFF state electric field breakdown voltage, crystallization temperature, melting temperature, or other considerations. It is noted that in FIG. 3, heating element 326 is transverse to PCM 332. Heating element 326 is illustrated with dashed lines as seen through various structures of PCM RF switch 320. Current flowing in heating element 326 flows approximately under active segment 334 of PCM 332.

PCM contacts 338 and 339 in PCM RF switch 320 are connected to passive segments 336 of PCM 332. Similarly, heater contacts 340 and 341 are connected to terminal segments 328 of heating element 326. PCM contacts 338 and 339 provide RF signals to and from PCM 332. Heater contacts 340 and 341 provide power to heating element 326 for generating a crystallizing heat pulse or an amorphizing heat pulse. In various implementations, PCM contacts 338 and 339 and heater contacts 340 and 341 can comprise tungsten (W), copper (Cu), or aluminum (Al). PCM contacts 338 and 339 and heater contacts 340 and 341 can extend through various dielectric layers (not shown in FIG. 3).

In one implementation, in order to ensure uniform contact between PCM 332 and PCM contacts 338 and 339, PCM contacts 338 and 339 can extend through a contact uniformity support layer (not shown in FIG. 3) situated on top of PCM 332, as disclosed in U.S. patent application Ser. No. 16/103,490 filed on Aug. 14, 2018, titled "Manufacturing RF Switch Based on Phase-Change Material." The disclosure and content of the above-identified application are incorporated fully by reference into the present application.

PCM RF switch 320 has low insertion loss and is able to provide several advantages. First, PCM 332 in the crystalline state has low resistivity, while PCM 332 in the amorphous state has high resistivity. In various implementations, PCM 332 may have an area of approximately ten square microns (10 $\mu m^2$), and the OFF state resistance ($R_{OFF}$) of PCM RF switch 320 can range from approximately ten kilo-Ohms to approximately one mega-Ohm (10 k$\Omega$-1 M$\Omega$), while the ON state resistance ($R_{ON}$) of PCM RF switch 320 can be approximately one Ohm (1$\Omega$) or less. In contrast, a conventional switch may need a channel area of approximately four hundred square microns (400 $\mu m^2$) to achieve the same $R_{ON}$.

Second, where an optional contact uniformity support layer is utilized as described above, PCM 332 will remain substantially intact, and PCM contacts 338 and 339 can uniformly contact passive segments 336 of PCM 332. Because the $R_{ON}$ of PCM RF switch 320 in FIG. 3 depends heavily on the uniformity of contacts made with PCM 332, the $R_{ON}$ will be significantly lower when an optional contact uniformity support layer is used.

Third, because PCM RF switch 320 includes lower dielectric 324 adjacent to sides of heating element 326, more heat dissipates vertically from heating element 326. Lower dielectric 324 under heating element 326 also performs as a heat valve that biases vertical heat dissipation from heating element 326 toward active segment 334 of PCM 332, rather than toward substrate 322, enabling PCM RF switch 320 to transition between OFF and ON states using even lower power and/or even quicker pulses. Thus, passive segments 336 are subjected to less thermal cycling consequences, and can be spaced more closely to decrease $R_{ON}$, as disclosed in U.S. patent application Ser. No. 16/103,587 filed on Aug. 14, 2018, titled "Design for High Reliability RF Switch Based on Phase-Change Material." The disclosure and content of the above-identified application are incorporated fully by reference into the present application.

Fourth, PCM contacts 338 and 339 can be formed crosswise to heater contacts 340 and 341, further reducing parasitic capacitive coupling. This reduction in parasitic capacitance values of PCM RF switch 320 is disclosed and described in U.S. patent application Ser. No. 16/161,960 filed on Oct. 16, 2018, titled "Phase-Change Material (PCM) Radio Frequency (RF) Switch with Reduced Parasitic Capacitance." The disclosure and content of the above-identified application are incorporated fully by reference into the present application.

In addition to having low insertion loss and the other advantages described above, PCM RF switch 320 is advantageously non-volatile. That is, active segment 334 of PCM 332 maintains its crystalline (ON state) or amorphous phase (OFF state) even when power is not supplied to heating element 326. PCM RF switch 320 requires less power than conventional switches when remaining in an ON state. Also, PCM RF switch 320 is resilient to voltage fluctuations in its programming, making PCM RF switch 320 particularly applicable in antenna tuners and other circuits which might experience large voltage fluctuations.

Figure 4A:
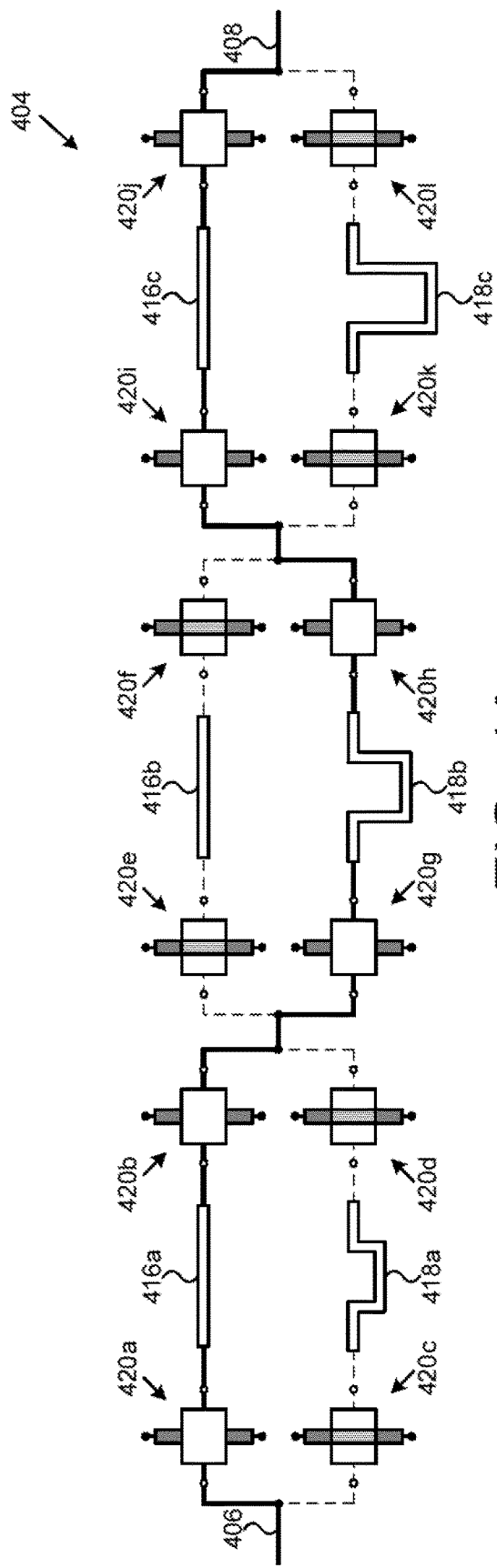
FIGS. 4A and 4B illustrate a portion of a non-volatile adjustable phase shifter employing non-volatile RF switches according to one implementation of the present application.
Figure 4B:
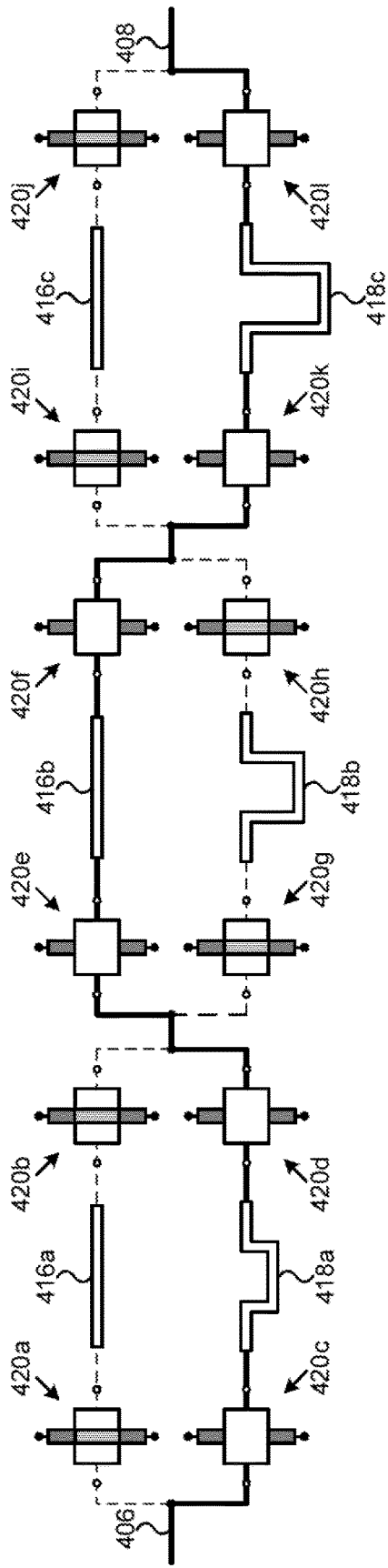

FIGS. 4A and 4B illustrate a portion of a non-volatile adjustable phase shifter employing non-volatile RF switches according to one implementation of the present application. Non-volatile adjustable phase shifter 404 in FIGS. 4A and 4B is a multi-bit phase shifter capable of causing more phase shifts relative to the single-bit non-volatile adjustable phase shifter 204 in FIGS. 2A and 2B. Non-volatile adjustable phase shifter 404 in FIGS. 4A and 4B includes terminals 406 and 408, PCM RF switches 420a, 420b, 420c, 420d, 420e, 420f, 420g, 420h, 420i, 420j, 420k, and 420l, collectively referred to as PCM RF switches 420, selectable transmission reference arms 416a, 416b, and 416c, and selectable transmission delay arms 418a, 418b, and 418c.

PCM RF switch 420a is arranged between terminal 406 and selectable transmission reference arm 416a. Selectable transmission reference arm 416a is arranged between PCM RF switch 420a and PCM RF switch 420b. PCM RF switch 420c is arranged between terminal 406 and selectable transmission delay arm 418a. Selectable transmission delay arm 418a is arranged between PCM RF switch 420c and PCM RF switch 420d. PCM RF switches 420a, 420b, 420c, and 420d, selectable transmission reference arm 416a, and selectable transmission delay arm 418a thus form a first stage of non-volatile adjustable phase shifter 404. PCM RF switches 420e, 420f, 420g, and 420h, selectable transmission reference arm 416b, and selectable transmission delay arm 418b form a second stage of non-volatile adjustable phase shifter 404 coupled to the first stage. PCM RF switches 420i, 420j, 420k, and 420l, selectable transmission reference arm 416c, and selectable transmission delay arm 418c form a third stage of non-volatile adjustable phase shifter 404 coupled between the second stage and terminal 408.

Non-volatile adjustable phase shifter 404 causes different phase shifts when a corresponding group of PCM RF switches 420 engages with or disengages from a respective group of selectable transmission delay arms 418a, 418b, and 418c. For example, selectable transmission delay arms 418a, 418b, and 418c may cause respective phase shifts of approximately eleven and one-fourth degrees (11.25°), approximately twenty-two and one-half degrees (22.5°), and approximately forty-five degrees (45°). As shown in FIG. 4A, PCM RF switches 420g and 420h engage with selectable transmission delay arm 418b, and PCM RF switches 420c, 420d, 420k, and 420l disengage from selectable transmission delay arms 418a and 418c. Non-volatile adjustable phase shifter 404 in FIG. 4A may cause a phase shift of approximately twenty-two and one-half degrees (22.5°).

As shown in FIG. 4B, non-volatile adjustable phase shifter 404 has been adjusted. PCM RF switches 420c, 420d, 420k, and 420l engage with selectable transmission delay arms 418a and 418c, and PCM RF switches 420g and 420h disengage from selectable transmission delay arm 418b. Non-volatile adjustable phase shifter 404 in FIG. 4B may cause a phase shift of approximately fifty-six and one-fourth degrees (56.25°) (i.e., the sum of phase delays from selectable transmission delay arms 418a and 418c).

In FIGS. 4A and 4B, PCM RF switches 420a, 420b, 420e, 420f, 420i, and 420j are configured to engage or disengage oppositely to PCM RF switches 420c, 420d, 420g, 420h, 420k, and 420l, to engage with or disengage from a respective group of selectable transmission reference arms 416a, 416b, and 416c. In FIGS. 4A and 4B, disengaged selectable transmission reference arus 416a, 416b, and 416c and disengaged selectable transmission delay arms 418a, 418b, and 418c are illustrated with dashed lines.

Continuing the above example, by using a corresponding group of PCM RF switches 420 to engage with or disengage from a respective group of selectable transmission delay arms 418a, 418b, 418c, a phase shift caused by non-volatile adjustable phase shifter 404 may be adjusted to be approximately zero degrees (0°), approximately eleven and one-fourth degrees (11.25°), approximately twenty-two and one-half degrees (22.5°), approximately thirty-three and three-fourth degrees (33.75°), approximately forty-five degrees (45°), approximately fifty-six and one-fourth degrees (56.25°), approximately sixty-seven and one-half degrees (67.5°), and approximately seventy-eight and three-fourth degrees (78.75°). Thus, non-volatile adjustable phase shifter 404 may be adjusted between eight combinations of phase shifts.

In various implementations, non-volatile adjustable phase shifter 404 may have more or fewer selectable transmission delay arms. For example, non-volatile adjustable phase shifter 404 can have M stages and $2^M$ combinations of phase shifts, in various implementations, selectable transmission delay arms 418a, 418b, and 418c can have different lengths and can cause different phase shifts than described above. For example, selectable transmission delay arms 418a, 418b, and 418c may cause respective phase shifts of approximately twenty-one degrees (21°), approximately twenty-two degrees (22°), and approximately twenty-three degrees (23°). In this implementation, only one of selectable transmission delay arms 418a, 418b, and 418c may be engaged at a time. This implementation may be suitable where fine phase shifting is needed, such as in communications between base stations where a desired angle of an RF beam may be expected to vary only slightly.

A phase shift caused by non-volatile adjustable phase shifter 404 is dependent on the frequency of an input RF signal. In one implementation, PCM RF switches 420 can engage with or disengage from a group of selectable transmission delay arms 418a, 418b, and 418c in response to a change in a frequency of RF signals being transmitted from or received by transceiver 102 in FIG. 1. Thus, non-volatile adjustable phase shifter 404 can be adjusted to provide a constant phase shift despite changes in frequency.

Because non non-volatile adjustable phase shifter 404 utilizes PCM RF switches 420 having low insertion losses, non-volatile adjustable phase shifter 404 is able to provide several advantages over conventional phase shifters using conventional switches. For example, at a frequency of about 5.0 GHz, an insertion loss of non-volatile adjustable phase shifter 404 may be less than or approximately equal to 1 decibel. In contrast, an insertion loss of a conventional phase shifter using conventional switches may be approximately 5 decibels. This insertion loss may render a phase shifter inoperable. It is noted that insertion losses generally increase at higher operating frequencies, such as frequencies used in 5G communications or in satellite communications. Thus, non-volatile adjustable phase shifter 404 enables phase shifting at higher frequencies.

It is also noted that, according to conventional techniques, using a multi-bit phase shifter having multiple stages, as shown in FIGS. 4A and 4B, significantly increases insertion losses; and using conventional switches may render multi-bit phase shifters inoperable. In contrast, non-volatile adjustable phase shifter 404 can include more stages and be adjusted amongst more combinations of phase shifts for a given total insertion loss. Thus, non-volatile adjustable phase shifter 404 improves flexibility and beam forming in wireless communication device 100. Alternatively, non-volatile adjustable phase shifter 404 can have a lower total insertion loss for a given number of combinations of phase shifts. Thus, non-volatile adjustable phase shifter 404 improves range and sensitivity in wireless communication device 100.

One approach used to compensate for high insertion losses of conventional phase shifters is to use active phase shifters. Active phase shifters include amplifiers to provide gains to RF signals and compensate for insertion losses. However, active phase shifters are non-reciprocal and only provide phase shifts in one direction. Further, active phase shifters are normally-ON due to their use of amplifiers and consume significant power.

In contrast, non-volatile adjustable phase shifter 404 in FIGS. 4A and 4B is reciprocal. Non-volatile adjustable phase shifter 404 can cause phase shifts in either direction and change a phase of corresponding RF signals being transmitted from or received by transceiver 102 in FIG. 1. Thus, non-volatile adjustable phase shifter 404 is suitable for duplexing operations, such as full-duplex and hall-duplex operations. Non-volatile adjustable phase shifter 404 also does not require an amplifier, saving costs and reducing design complexity. Further, non-volatile adjustable phase shifter 404 is non-volatile and only requires power when engaging or disengaging PCM RF switches 420 and adjusting phase shifts. Thus, a battery-powered consumer electronic device employing non-volatile adjustable phase shifter 404 can operate longer and/or at higher voltages or currents.

Also, because adjustable phase shifter 404 is non-volatile, it is especially suitable for applications having low scan speeds. For example, if it is known that a phased array antenna panel will maintain an RF beam at a desired angle θ for a period of ten milliseconds (10 ms), the ON or OFF states of PCM RF switches 420 can remain unchanged during this period. Meanwhile, non-volatile adjustable phase shifter 404 will continue to cause the phase shift needed to maintain the RF beam at the desired angle θ, while no power need be consumed to maintain or change the states of PCM RF switches 420. As another example, non-volatile adjustable phase shifter 404 can be used in communications between base stations where a desired angle θ of an RF beam may be expected to vary only slightly, for example, in response to weather. The longer the period a phase shift is maintained in a given application, the more power non-volatile adjustable phase shifter 404 saves relative to conventional phase shifters using conventional switches.

Figure 5B:
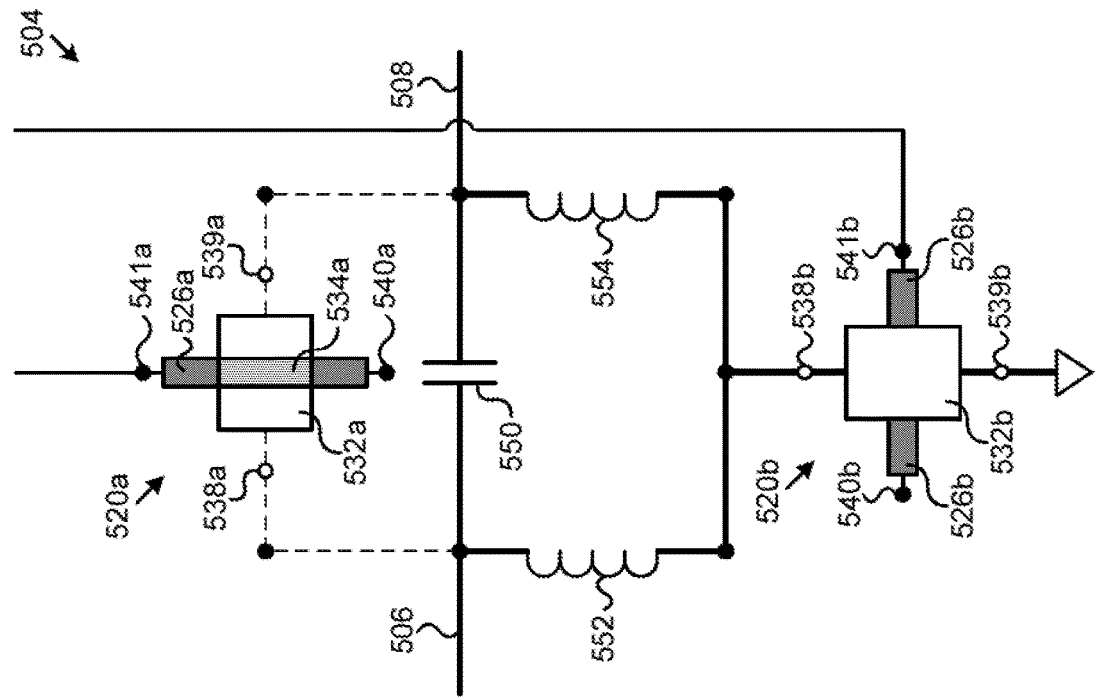
FIGS. 5A and 5B illustrate a portion of a non-volatile adjustable phase shifter employing non-volatile RF switches according to one implementation of the present application.
Figure 5A:
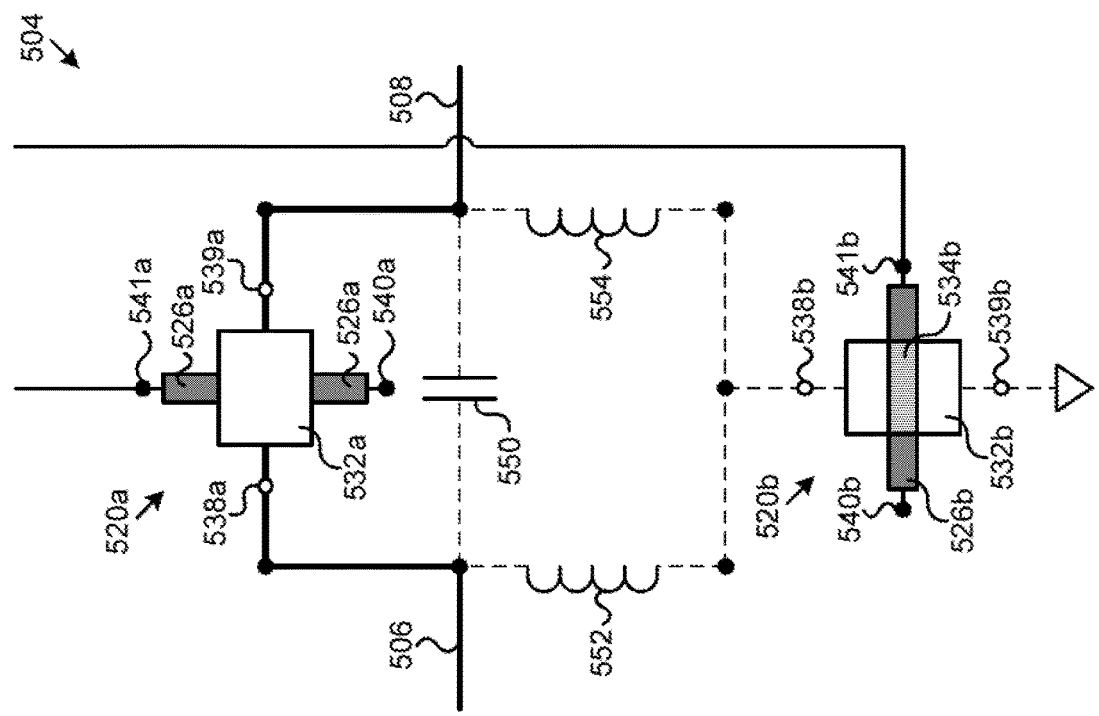

FIGS. 5A and 5B illustrate a portion of a non-volatile adjustable phase shifter employing non-volatile RF switches according to one implementation of the present application. Non-volatile adjustable phase shifter 504 includes terminals 506 and 508, PCM RF switches 520a and 520b, selectable impedance elements 550, 552, and 554. Non-volatile adjustable phase shifter 504 in FIGS. 5A and 5B generally corresponds to any of non-volatile adjustable phase shifters 104 in FIG. 1. Similarly, terminals 506 and 508 in FIGS. 5A and 5B generally correspond to any of terminals 106 and 108 respectively in FIG. 1. Any of PCM RF switches 520a and 520b in FIGS. 5A and 5B generally corresponds to PCM RF switch 320 in FIG. 3, and may have any implementations or advantages described above.

PCM RF switch 520a includes heating element 526a, PCM 532a, PCM contacts 538a and 539a, and heater contacts 540a and 541a. Similarly, PCM RF switch 520b includes heating element 526b, PCM 532b, PCM contacts 538b and 539b, and heater contacts 540b and 541b.

Terminal 506 is coupled to PCM contact 538a of PCM RF switch 520a, one end of selectable impedance element 550, and one end of selectable impedance element 552. PCM contact 539a of PCM RF switch 520a is coupled to terminal 508. Another end of selectable impedance element 552 is coupled to PCM contact 538b of PCM RF switch 520b and to one end of selectable impedance element 554. PCM contact 539b of PCM RF switch 520b is coupled to ground. Another end of selectable impedance element 554 is coupled to another end of selectable impedance element 550 and to terminal 508. Heater contacts 541a and 541b of respective PCM RF switches 520a and 520b can be coupled to a pulse generator (not shown in FIG. 5A or 5B) that generates electrical pulses and provides power to respective heating elements 526a and 526b. Heater contacts 540a and 540b of respective PCM RF switches 520a and 520b can be coupled to ground (not shown in FIG. 5A or 5B).

In non-volatile adjustable phase shifter 504, PCM RF switch 520b engages with and disengages from selectable impedance elements 550, 552, and 554. That is, PCM RF switch 520b is engaged with selectable impedance elements 550, 552, and 554 when active segment 534b of PCM 532b is in a crystalline phase, and PCM RF switch 520b is disengaged from selectable impedance elements 550, 552, and 554 when active segment 534b of PCM 532b is in an amorphous phase.

Non-volatile adjustable phase shifter 504 causes different phase shifts when selectable impedance elements 550, 552, and 554 are engaged. In FIG. 5A, PCM RF switch 520a is in an ON state. PCM 532a is in a crystalline phase, has low resistivity, and is able to easily conduct electrical current. An RF signal at terminal 506 propagates across PCM RF switch 520a through PCM contact 538a, PCM 532a, and PCM contact 539a, to terminal 508. PCM RF switch 520a essentially shorts terminals 506 and 508, and RF signals bypass selectable impedance elements 550, 552, and 554. Non-volatile adjustable phase shifter 504 in FIG. 5A may have a phase shift of approximately zero degrees (0°).

In FIG. 5A, PCM RF switch 520b is in an OFF state. Active segment 534b of PCM 532b is in an amorphous phase, has high resistivity, and does not easily conduct electrical current. An RF signal at terminal 506 does not propagates across selectable impedance elements 550, 552, and 554 or PCM RF switch 520b. Accordingly, PCM RF switch 520b disengages from selectable impedance elements 550, 552, and 554, as illustrated with dashed lines in FIG. 5A.

In FIG. 5B, PCM RF switches 520a and 520b have changed states. Heating element 526a has generated an amorphizing heat pulse, for example, in response to an electrical pulse from controller 114 in FIG. 1. Active segment 534a of respective PCM 532a has transformed from a crystalline phase to an amorphous phase that does not easily conduct electrical current. PCM RF switch 520a in FIG. 5B is in an OFF state. Accordingly, PCM RF switch 520a disengages from selectable impedance elements 550, 552, and 554, as illustrated with dashed lines in FIG. 5B.

Conversely, heating element 526b has generated a crystallizing heat pulse, for example, in response to an electrical pulse from controller 114 in FIG. 1. Active segment 534b of PCM 532b has transformed from an amorphous phase to a crystalline phase that is able to easily conduct electrical current. PCM RF switch 520b in FIG. 5B is in an ON state. Accordingly. PCM RF switch 520b engages with selectable impedance elements 550, 552, and 554. Non-volatile adjustable phase shifter 504 in FIG. 5B may have a phase shift of approximately twenty-two and one-half degrees (22.5°).

In the present implementation, selectable impedance element 550 is a capacitor and selectable impedance elements 552 and 554 are inductors. When selectable impedance elements 550, 552, and 554 are engaged, they introduce impedances relative to when selectable impedance elements 550, 552, and 554 are disengaged, causing an output RF signal to have a phase shift relative to an input RF signal.

In various implementations, selectable impedance elements 550, 552, and 554 can be capacitors, inductors, resistors, varactors, or any other impedance elements known in the art. In various implementations, non-volatile adjustable phase shifter 504 can include more or fewer selectable impedance elements having various values and various arrangements. In various implementations, selectable impedance elements 550, 552, and 554 can be engaged by more than one PCM RF switch. In various implementations, non-volatile adjustable phase shifter 504 can employ any non-volatile switch known in the art.

A phase shift caused by non-volatile adjustable phase shifter 504 is dependent on the frequency of an input RF signal. However, a phase shift caused by non-volatile adjustable phase shifter 504 in FIGS. 5A and 5B may exhibit less dependence on the frequency of an input RF signal relative to non-volatile adjustable phase shifter 204 in FIGS. 2A and 2B.

Figure 6:
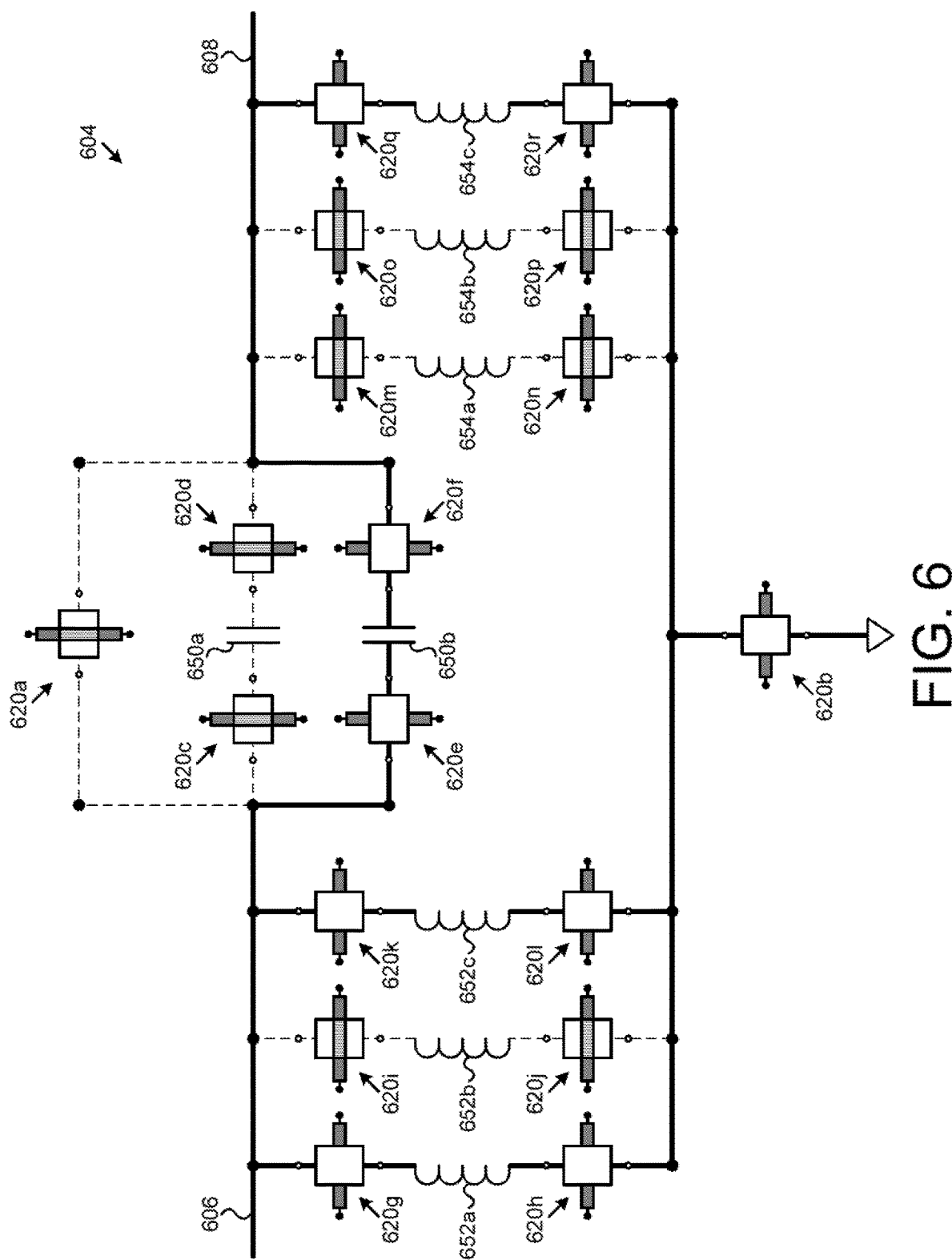
FIG. 6 illustrates a portion of a non-volatile adjustable phase shifter employing non-volatile RF switches according to one implementation of the present application.

FIG. 6 illustrates a portion of a non-volatile adjustable phase shifter employing non-volatile RF switches according to one implementation of the present application. Non-volatile adjustable phase shifter 604 in FIG. 6 is a multi-bit phase shifter capable of causing more phase shifts relative to the single-bit non-volatile adjustable phase shifter 504 in FIGS. 5A and 5B. Non-volatile adjustable phase shifter 604 in FIG. 6 includes terminals 606 and 608, PCM RF switches 620a, 620b, 620c, 620d, 620e, 620f, 620g, 620h, 620i, 620j, 620k, 620l, 620m, 620n, 620o, 620p, 620q, and 620r, collectively referred to as PCM RF switches 620, and selectable impedance elements 650a, 650b, 652a, 652b, 652c, 654a, 654b, and 654c.

Non-volatile adjustable phase shifter 604 in FIG. 6 is similar to non-volatile adjustable phase shifter 504 in FIGS. 5A and 5B, except that selectable impedance elements 550, 552, and 554 in FIGS. 5A and 5B are replaced by parallel combinations of selectable impedance elements, where each selectable impedance element is arranged between two of PCM RF switches 620. For example, selectable impedance element 550 in FIGS. 5A and 5B is replaced by the parallel combination of selectable impedance elements 650a and 650b in FIG. 6. Likewise, selectable impedance element 552 in FIGS. 5A and 5B is replaced by the parallel combination of selectable impedance elements 652a, 652b, and 652c in FIG. 6. Likewise, selectable impedance element 554 in FIGS. 5A and 5B is replaced by the parallel combination of selectable impedance elements 654a, 654b, and 654c in FIG. 6. Each of selectable impedance elements 650a, 650b, 657a, 652b, 652c, 654a, 654b, and 654c is arranged between two of PCM RF switches 620.

Non-volatile adjustable phase shifter 604 causes different phase shifts when a corresponding group of PCM RF switches 620 engages with or disengages from a respective group of selectable impedance elements 650a, 650b, 652a, 652b, 652c, 654a, 654b, and 654c. As shown in FIG. 6, PCM RF switches 620 engage with selectable impedance elements 650b, 652a, 652c, and 654c, and PCM RF switches 620 disengage from selectable impedance elements 650a, 652b, 654a, and 654b. Non-volatile adjustable phase shifter 604 in FIG. 6 may cause a phase shift of approximately twenty-two and one-half degrees (22.5°). In another implementation, non-volatile adjustable phase shifter 604 may be adjusted by engaging with or disengaging from another group of selectable impedance elements 650a, 650b, 652a, 652b, 652c, 654a, 654b, and 654c, and non-volatile adjustable phase shifter 604 may cause another phase shift. As described above, when PCM RF switch 620a is engaged, non-volatile adjustable phase shifter 604 essentially shorts terminals 606 and 608, and RF signals bypass selectable impedance elements 650a, 650b, 652a, 652b, 652c, 654a, 654b, and 654c.

In the present implementation, non-volatile adjustable phase shifter 604 has seven selectable impedance elements, and can have as many as 129 combinations of phase shifts ($2^7$ combinations, plus 1 bypass). In various implementations, non-volatile adjustable phase shifter 604 may have more or fewer selectable impedance elements. For example, non-volatile adjustable phase shifter 604 can have M selectable impedance elements and $2^M+1$ combinations of phase shifts.

In one implementation, PCM RF switches 620 can engage with or disengage from a group of selectable impedance elements 650a, 650b, 652a, 652b, 652c, 654a, 654b, and 654c in response to a change in a frequency of RF signals being transmitted from or received by transceiver 102 in FIG. 1. Thus, non-volatile adjustable phase shifter 604 can be adjusted to provide a constant phase shift despite changes in frequency.

In the present implementation, selectable impedance element 650a and 650b are capacitors and selectable impedance elements 652a, 652b, 652c, 654a, 654b, and 654c are inductors. In various implementations, selectable impedance elements 650a, 650b, 652a, 652b, 652c, 654a, 654b, and 654c can be capacitors, inductors, resistors, varactors, or any other impedance elements known in the an. In various implementations, non-volatile adjustable phase shifter 604 can include more or fewer selectable impedance elements having various values and various arrangements. In various implementations, selectable impedance elements 650*a*, 650*b*, 652*a*, 652*b*, 652*c*, 654*a*, 654*b*, and 654*c* can be engaged by more than one PCM RF switch. In various implementations, non-volatile adjustable phase shifter 604 can employ any non-volatile switch known in the art.

Because non-volatile adjustable phase shifter 604 utilizes PCM RF switches 620 having low insertion losses, non-volatile adjustable phase shifter 604 enables phase shifting at higher operating frequencies, as described above. Non-volatile adjustable phase shifter 604 improves flexibility, directivity, range, and sensitivity in wireless communication device 100. Non-volatile adjustable phase shifter 604 in FIG. 6 is reciprocal and enables duplex operations. Non-volatile adjustable phase shifter 604 also does not require an amplifier, saving costs and reducing design complexity.

Further, non-volatile adjustable phase shifter 604 is non-volatile and only requires power when engaging or disengaging PCM RF switches 620 and adjusting phase shifts. Thus, a battery-powered consumer electronic device employing non-volatile adjustable phase shifter 604 can operate longer and/or at higher voltages or currents. Also, because non-volatile adjustable phase shifter 604 is non-volatile, it saves significant power in applications having low scan speeds.

Thus, various implementations of the present application achieve non-volatile adjustable phase shifting utilizing the inventive PCM RF switch of the present application and novel combinations to overcome the deficiencies in the art to provide non-volatility and lower insertion loss. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A non-volatile adjustable phase shifter coupled to a transceiver in a wireless communication device, said non-volatile adjustable phase shifter comprising:
a non-volatile RF switch;
a selectable transmission delay arm and a selectable transmission reference arm;
said non-volatile adjustable phase shifter configured to change a phase of RF signals being transmitted from or received by said transceiver when said non-volatile RF switch engages with or disengages from said selectable transmission delay arm;
wherein said non-volatile RF switch is a phase-change material (PCM) RF switch comprising:
a PCM and a heating element transverse to said PCM, said heating element approximately defining an active segment of said PCM and passive segments of said PCM;
PCM contacts situated on top of said passive segments of said PCM and not situated on sides of said PCM;
wherein said heating element is transverse to said PCM such that said PCM contacts situated on top of said passive segments of said PCM do not overlie said heating element;
a contact uniformity support layer situated on said PCM.

2. The non-volatile adjustable phase shifter of claim 1, wherein said non-volatile RF switch engages with said selectable transmission delay arm when said active segment of said PCM is in a crystalline phase, and wherein said non-volatile RF switch disengages from said selectable transmission delay arm when said active segment of said PCM is in an amorphous phase.

3. The non-volatile adjustable phase shifter of claim 1, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

4. The non-volatile adjustable phase shifter of claim 1, wherein said non-volatile adjustable phase shifter is coupled to an antenna in said wireless communication device.

5. A plurality of non-volatile adjustable phase shifters coupled to a transceiver in a wireless communication device, each of said plurality of non-volatile adjustable phase shifters comprising:
a plurality of non-volatile RF switches;
a plurality of selectable transmission delay arms and a plurality of selectable transmission reference arms;
said plurality of non-volatile adjustable phase shifters configured to change a phase of corresponding RF signals being transmitted from or received by said transceiver when a corresponding group of said plurality of non-volatile RF switches engages with or disengages from a respective group of said plurality of selectable transmission delay arms;
wherein said plurality of non-volatile RF switches are phase-change material (PCM) RF switches comprising:
PCMs and heating elements transverse to said PCMs, said heating elements approximately defining active segments of said PCMs and passive segments of said PCMs;
PCM contacts situated on top of said passive segments of said PCMs and not situated on sides of said PCMs;
wherein said heating elements are transverse to said PCMs such that said PCM contacts situated on top of said passive segments of said PCMs do not overlie said heating elements;
contact uniformity support layers situated on said PCMs.

6. The plurality of non-volatile adjustable phase shifters of claim 5, wherein said each of said non-volatile adjustable phase shifters is coupled to a corresponding antenna in a phased array antenna panel utilized in 5G communications.

7. The plurality of non-volatile adjustable phase shifters of claim 5, wherein said corresponding group of said plurality of non-volatile RF switches engages with said respective group of said plurality of selectable transmission delay arms when said active segments of said PCMs are in crystalline phases, and wherein said corresponding group of said plurality of non-volatile RF switches disengages from said respective group of said plurality of selectable transmission delay arms when said active segments of said PCMs are in amorphous phases.

8. The plurality of non-volatile adjustable phase shifters of claim 5, wherein said PCMs are selected from the group consisting of germanium telluride ($Ge_XTe_Y$), germanium antimony telluride (Ge$_X$Sb$_Y$Te$_Z$), germanium selenide (Ge$_X$Se$_Y$), and any other chalcogenide.

9. A non-volatile adjustable phase shifter coupled to a transceiver in a wireless communication device, said non-volatile adjustable phase shifter comprising:
  a non-volatile RF switch;
  a selectable impedance element;
  said non-volatile adjustable phase shifter configured to change a phase of RF signals being transmitted from or received by said when said non-volatile RF switch engages with or disengages from said selectable impedance element;
  wherein said non-volatile RF switch is a phase-change material (PCM) RF switch comprising:
    a PCM and a heating element transverse to said PCM, said heating element approximately defining an active segment of said PCM and passive segments of said PCM;
    PCM contacts situated on top of said passive segments of said PCM and not situated on sides of said PCM;
    wherein said heating element is transverse to said PCM such that said PCM contacts situated on top of said passive segments of said PCM do not overlie said heating element;
    a contact uniformity support layer situated on said PCM.

10. The non-volatile adjustable phase shifter of claim 9, wherein said selectable impedance element is chosen from the group consisting of a capacitor and an inductor.

11. The non-volatile adjustable phase shifter of claim 9, wherein said non-volatile adjustable phase shifter is coupled to an antenna in said wireless communication device.

12. The non-volatile adjustable phase shifter of claim 11, wherein said antenna is part of a phased array antenna panel utilized in 5G communications.

13. A The non-volatile adjustable phase shifter of claim 9, wherein said non-volatile RF switch engages with said selectable impedance element when said active segment of said PCM is in a crystalline phase, and wherein said non-volatile RF switch disengages from said selectable impedance element when said active segment of said PCM is in an amorphous phase.

14. The non-volatile adjustable phase shifter of claim 9, wherein said PCM is selected from the group consisting of germanium telluride (Ge$_X$Te$_Y$), germanium antimony telluride (Ge$_X$Sb$_Y$Te$_Z$), germanium selenide (Ge$_X$Se$_Y$), and any other chalcogenide.

15. The non-volatile adjustable phase shifter of claim 1, wherein said PCM contacts extend through said contact uniformity support layer.

16. The plurality of non-volatile adjustable phase shifters of claim 5, wherein said PCM contacts extend through said contact uniformity support layers.

17. The non-volatile adjustable phase shifter of claim 9, wherein said PCM contacts extend through said contact uniformity support layer.

* * * * *